United States Patent
Sugiyama et al.

(10) Patent No.: US 8,767,110 B2
(45) Date of Patent: Jul. 1, 2014

(54) SOLID-STATE IMAGE PICKUP DEVICE

(75) Inventors: Yukinobu Sugiyama, Hamamatsu (JP);
Tasuku Joboji, Hamamatsu (JP);
Tetsuya Abe, Hamamatsu (JP);
Takayuki Kurashina, Hamamatsu (JP);
Yuta Suzuki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/379,493

(22) PCT Filed: Jul. 21, 2010

(86) PCT No.: PCT/JP2010/062229
§ 371 (c)(1),
(2), (4) Date: Dec. 20, 2011

(87) PCT Pub. No.: WO2011/013548
PCT Pub. Date: Feb. 3, 2011

(65) Prior Publication Data
US 2012/0099010 A1 Apr. 26, 2012

(30) Foreign Application Priority Data
Jul. 30, 2009 (JP) ................................. 2009-177871

(51) Int. Cl.
*H04N 5/335* (2011.01)
(52) U.S. Cl.
USPC .......................................... 348/308; 348/294
(58) Field of Classification Search
USPC ........... 348/308, 294, 302, 312; 257/291–292
See application file for complete search history.

(56) References Cited

U.S. PATENT DOCUMENTS

| | | | |
|---|---|---|---|
| 5,410,348 A | | 4/1995 | Hamasaki |
| 6,505,701 B2 * | | 1/2003 | Juul et al. ...................... 180/418 |
| 6,590,611 B1 * | | 7/2003 | Ishida et al. .................. 348/310 |
| 6,798,451 B1 * | | 9/2004 | Suzuki et al. ................. 348/294 |
| 6,975,357 B1 * | | 12/2005 | Suzuki et al. ................. 348/308 |
| 7,068,315 B1 * | | 6/2006 | Suzuki et al. ................. 348/308 |
| 7,209,171 B2 * | | 4/2007 | Suzuki et al. ................. 348/308 |
| 8,081,235 B2 * | | 12/2011 | Kishi et al. ................. 348/226.1 |
| 2007/0285548 A1 | | 12/2007 | Gomi |
| 2008/0258045 A1 * | | 10/2008 | Oike et al. ................. 250/208.1 |
| 2008/0284885 A1 * | | 11/2008 | Taura ............................ 348/300 |
| 2010/0321532 A1 * | | 12/2010 | Hashimoto et al. ........... 348/234 |

FOREIGN PATENT DOCUMENTS

| | | |
|---|---|---|
| JP | 10-93358 | 4/1998 |
| JP | 2000-209503 | 7/2000 |
| JP | 2001-069408 | 3/2001 |
| JP | 2003-032551 | 1/2003 |
| JP | 2005-277513 | 10/2005 |

(Continued)

*Primary Examiner* — Nhan T Tran
*Assistant Examiner* — Chan Nguyen
(74) *Attorney, Agent, or Firm* — Drinker Biddle & Reath LLP

(57) ABSTRACT

A solid-state image pickup device 1 includes a light receiving section 10, a first row selecting section 20, a second row selecting section 30, a first readout section 40, a second readout section 50, and a control section 60. Data of pixel units of rows in the light receiving section 10 selected by the first row selecting section 20 are output by the first readout section 40 to obtain image pickup data, and further, data of the pixel units of rows in the light receiving section 10 selected by the second row selecting section 30 are output by the second readout section 50 to obtain communication data.

7 Claims, 11 Drawing Sheets

(56) References Cited

FOREIGN PATENT DOCUMENTS

| JP | 2005-354568 | 12/2005 |
|----|-------------|---------|
| JP | 3995959 | 8/2007 |
| JP | 2007-324985 | 12/2007 |
| JP | 2008-263452 | 10/2008 |
| JP | 2009-111725 | 5/2009 |
| WO | WO 01/17234 | 3/2001 |

* cited by examiner

SOLID-STATE IMAGE PICKUP DEVICE

TECHNICAL FIELD

The present invention relates to a solid-state image pickup device.

BACKGROUND ART

A solid-state image pickup device includes a light receiving section where M×N pixel units $P_{1,1}$ to $P_{M,N}$ each including a photodiode and a charge accumulating section are two-dimensionally arrayed in M rows and N columns, a row selecting section that causes each pixel unit $P_{m,n}$ in a light receiving section to accumulate charge generated in its photodiode during a given period in its charge accumulating section, and to output data corresponding to an amount of the charge accumulated in each pixel unit $P_{m,n}$ in every row, and a readout section for which the data output from each pixel unit $P_{m,n}$ in the light receiving section is input and from which data corresponding to an amount of charge generated in the photodiode of each pixel unit $P_{m,n}$ is output. Also, in some cases, the solid-state image pickup device further includes an AD conversion section that analog/digital-converts the data output from the readout section to output a digital value.

Such a solid-state image pickup device is capable of detecting an intensity of light reaching each pixel unit $P_{m,n}$ in its light receiving section, to perform image pickup. Further, in recent years, not only image pickup, but an attempt has been made to perform optical communication by using such a solid-state image pickup device. For example, a solid-state image pickup device of the invention disclosed in Patent Literature 1 has a plurality of means for reading out data from each pixel unit, and is capable of performing image pickup by reading out data by every pixel unit with the first readout means among those. Further, the solid-state image pickup device adds current signals generated from photodiodes of specific one pixel unit, or two or more pixel units to output the signal with the second readout means, so that the solid-state image pickup device is capable of receiving an optical signal.

CITATION LIST

Patent Literature

Patent Literature 1: Japanese Patent No. 3995959

SUMMARY OF INVENTION

Technical Problem

It is necessary that the solid-state image pickup device of the invention disclosed in Patent Literature 1 include a storage section that stores data that is read out by any of the readout means, and a large number of switches for switching among output routes in order to read out data by specific readout means according to the stored content for every pixel unit. Therefore, the solid-state image pickup device of the invention disclosed in Patent Literature 1 has a larger region area per pixel unit and a smaller aperture ratio that is a ratio of an entire region area of the photodiode to a region area of the light receiving section in comparison with a conventional solid-state image pickup device.

It is necessary that the solid-state image pickup device of the invention disclosed in Patent Literature 1 include second signal readout means of a number which is the same as the number of the assumed optical signal receiving regions when it is assumed that there is a plurality of optical signal receiving regions in the light receiving section. Therefore, with this, the solid-state image pickup device of the invention disclosed in Patent Literature 1 has a larger region area per pixel unit and a smaller aperture ratio in comparison with a conventional solid-state image pickup device.

Moreover, in a case where the solid-state image pickup device of the invention disclosed in Patent Literature 1 includes K second signal readout means, when there are optical signal receiving regions of a number greater than K in the light receiving section, the solid-state image pickup device is incapable of receiving an optical signal reaching any of the optical signal receiving regions.

The present invention has been achieved in order to solve the above-described problems. An object of the present invention is to provide a solid-state image pickup device for optical communication which is capable of suppressing an increase in region area per pixel unit and a reduction in aperture ratio, and is capable of flexibly responding to a variation in the number of optical signal receiving regions in its light receiving section.

Solution to Problem

A solid-state image pickup device according to the present invention includes (1) a light receiving section where M×N pixel units $P_{1,1}$ to $P_{M,N}$ each including a photodiode that generates charge of an amount according to an incident light amount, a charge accumulating section in which the charge is accumulated, a first switch for outputting data corresponding to an accumulated charge amount in the charge accumulating section, and a second switch for outputting data corresponding to the accumulated charge amount in the charge accumulating section are two-dimensionally arrayed in M rows and N columns, (2) a first row selecting section which selects any m1-th row in the light receiving section, and causes each pixel unit $P_{m1,n}$ of the row to accumulate the charge generated in the photodiode in the charge accumulating section, and to output data corresponding to the accumulated charge amount in the charge accumulating section to a readout signal line $L1_n$ by closing the first switch, (3) a second row selecting section which selects any m2-th row in the light receiving section, and causes each pixel unit $P_{m2,n}$ of the row to accumulate the charge generated in the photodiode in the charge accumulating section, and to output data corresponding to the accumulated charge amount in the charge accumulating section to a readout signal line $L2_n$ by closing the second switch, (4) a first readout section which is connected to N readout signal lines $L1_1$ to $L1_N$, for which data output from each pixel unit $P_{m1,n}$ of the m1-th row in the light receiving section selected by the first row selecting section to the readout signal line $L1_n$ is input, and from which data corresponding to an amount of the charge generated in the photodiode of each pixel unit $P_{m1,n}$ of the m1-th row is output, and (5) a second readout section which is connected to N readout signal lines $L2_1$ to $L2_N$, for which data output from each pixel unit $P_{m2,n}$ of the m2-th row in the light receiving section selected by the second row selecting section to the readout signal line $L2_n$ is input, and from which data corresponding to an amount of the charge generated in the photodiode of each pixel unit $P_{m2,n}$ of the m2-th row is output. Moreover, in the solid-state image pickup device according to the present invention, the first row selecting section and the second row selecting section select rows different from each other in the light receiving section, and the first row selecting section and the first readout section, and the second row selecting section and the second readout section operate in parallel with each other (provided that M and N are each an integer not less than 2, m, m1, and m2 are each an integer not less than 1 and not more than M, and n is an integer not less than 1 and not more than N).

In the solid-state image pickup device according to the present invention, any m1-th row in the light receiving section is selected by the first row selecting section, and in each pixel unit $P_{m1,n}$ of the row, the charge generated in the photodiode is accumulated in the charge accumulating section, and the data corresponding to the accumulated charge amount in the charge accumulating section is output to the readout signal line $L1_n$ by closing the first switch. In the first readout section which is connected to each readout signal $L1_n$, data output from each pixel unit $P_{m1,n}$ of the m1-th row in the light receiving section selected by the first row selecting section to the readout signal line $L1_n$ is input, and data corresponding to the amount of charge generated in the photodiode of each pixel unit $P_{m1,n}$ of the m1-th row is output.

On the other hand, any m2-th row in the light receiving section is selected by the second row selecting section, and in each pixel unit $P_{m2,n}$ of the row, the charge generated in the photodiode is accumulated in the charge accumulating section, the data corresponding to the accumulated charge amount in the charge accumulating section is output to a readout signal line $L2_n$ by closing the second switch. In the second readout section which is connected to each readout signal line $L2_n$, data output from each pixel unit $P_{m2,n}$ of the m2-th row in the light receiving section selected by the second row selecting section to the readout signal line $L2_n$ is input, and data corresponding to the amount of charge generated in the photodiode of each pixel unit $P_{m2,n}$ of the m2-th row is output.

Rows different from each other in the light receiving section are selected by the first row selecting section and the second row selecting section. Then, the first row selecting section and the first readout section, and the second row selecting section and the second readout section operate in parallel with each other. Thereby, for example, image data by the first row selecting section and the first readout section is obtained, and communication data by the second row selecting section and the second readout section is obtained.

In the solid-state image pickup device according to the present invention, it is preferable that (a1) in the light receiving section, a control signal line for providing control signals giving instructions for discharge from each of a junction capacitance section of the photodiode and the charge accumulating section in each pixel unit $P_{m,n}$ and for charge accumulation by the charge accumulating section to each pixel unit $P_{m,n}$, be provided to every row, and a switch or a tri-state buffer be provided to each terminal of each control signal line, (b1) the first row selecting section output the control signal to the control signal line via the switch or the tri-state buffer provided to a first terminal of the control signal line of the m1-th row, and (c1) the second row selecting section output the control signal to the control signal line via the switch or the tri-state buffer provided to a second terminal of the control signal line of the m2-th row.

In this case, it is preferable that (b2) the first row selecting section include M latch circuits, and when data held in an m1-th latch circuit among the M latch circuits is a significant value, the first row selecting section output the control signal to the control signal line via the switch or the tri-state buffer provided to the first terminal of the control signal line of the m1-th row, and (c2) the second row selecting section include M latch circuits, and when data held in an m2-th latch circuit among the M latch circuits is a significant value, the second row selecting section output the control signal to the control signal line via the switch or the tri-state buffer provided to the second terminal of the control signal line of the m2-th row.

Alternatively, in the solid-state image pickup device according to the present invention, it is preferable that (a3) in the light receiving section, a control signal line for providing control signals giving instructions for discharge from each of a junction capacitance section of the photodiode and the charge accumulating section in each pixel unit $P_{m,n}$ and for charge accumulation by the charge accumulating section to each pixel unit $P_{m,n}$, be provided to every row, and an OR circuit be provided to one terminal of each control signal line, (b3) the first row selecting section output the control signal to the control signal line via the OR circuit provided to the one terminal of the control signal line of the m1-th row, and (c3) the second row selecting section output the control signal to the control signal line via the OR circuit provided to the one terminal of the control signal line of the m2-th row.

In this case, it is preferable that (b4) the first row selecting section include M latch circuits, and when data held in an m1-th latch circuit among the M latch circuits is a significant value, the first row selecting section output the control signal to the control signal line via the OR circuit provided to the one terminal of the control signal line of the m1-th row, and (c4) the second row selecting section include M latch circuits, and when data held in an m2-th latch circuit among the M latch circuits is a significant value, the second row selecting section output the control signal to the control signal line via the OR circuit provided to the one terminal of the control signal line of the m2-th row.

In the solid-state image pickup device according to the present invention, it is preferable that the M latch circuits of each of the first row selecting section and the second row selecting section be cascade-connected in order of the rows, to compose a shift register, and M-bit data be serial-input to a latch circuit at the first stage in the shift register, to cause each latch circuit to hold data.

In the solid-state image pickup device according to the present invention, it is preferable that the first row selecting section sequentially output the control signals at a constant time interval to a plurality of rows corresponding to latch circuits with holding data of significant values among the M latch circuits included in the first row selecting section, and the second row selecting section sequentially output the control signals at a constant time interval to a plurality of rows corresponding to latch circuits with holding data of significant values among the M latch circuits included in the second row selecting section.

Advantageous Effects of Invention

The solid-state image pickup device according to the present invention is capable of suppressing an increase in region area per pixel unit and a reduction in aperture ratio, and is capable of flexibly responding to a variation in the number of optical signal receiving regions in its light receiving section.

DESCRIPTION OF EMBODIMENTS

Figure 1:
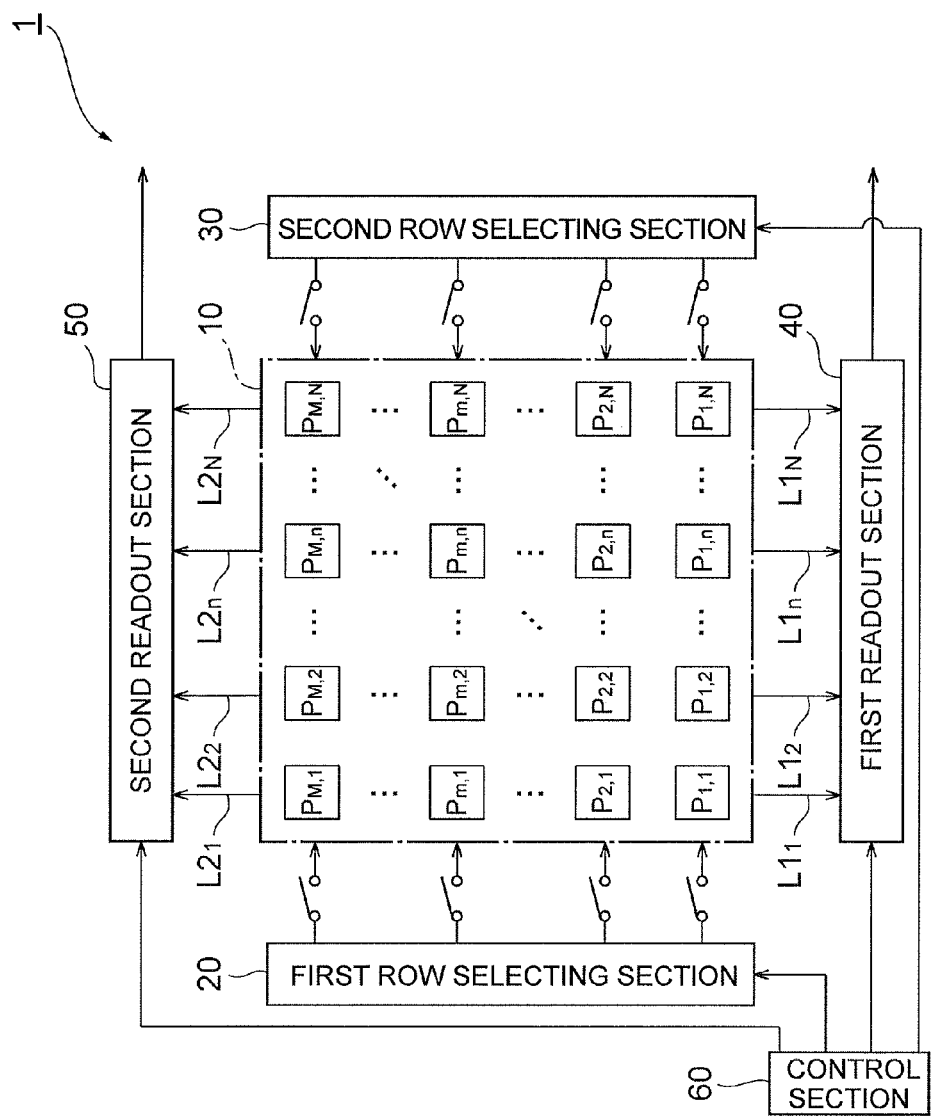
FIG. 1 is a diagram showing a schematic configuration of a solid-state image pickup device 1 according to a first embodiment.

Hereinafter, embodiments of the present invention will be described in detail with reference to the accompanying drawings. Also, the same components will be denoted with the same reference numerals in the description of the drawings, and overlapping description will be omitted.

First Embodiment

FIG. 1 is a diagram showing a schematic configuration of a solid-state image pickup device 1 according to a first embodiment.

The solid-state image pickup device 1 shown in this figure includes a light receiving section 10, a first row selecting section 20, a second row selecting section 30, a first readout section 40, a second readout section 50, and a control section 60.

The light receiving section 10 includes M×N pixel units $P_{1,1}$ to $P_{M,N}$. The M×N pixel units $P_{1,1}$ to $P_{M,N}$ have a common configuration, and these are two-dimensionally arrayed in M rows and N columns. Each pixel unit $P_{m,n}$ is located in the m-th row and the n-th column. Here, M and N are each an integer not less than 2, and m is an integer not less than 1 and not more than M, and n is an integer not less than 1 and not more than N.

Each pixel unit $P_{m,n}$ has a photodiode that generates charge of an amount according to an incident light amount and a charge accumulating section in which the charge is accumulated. Each pixel unit $P_{m,n}$ accumulates charge generated in its photodiode in its charge accumulating section on the basis of various control signals received via control signal lines from the first row selecting section 20 or the second row selecting section 30, and outputs data corresponding to the accumulated charge amount in the charge accumulating section to a readout signal line $L1_n$ or a readout signal line $L2_n$.

The first row selecting section 20 selects any m1-th row in the light receiving section 10, and causes each pixel unit $P_{m1,n}$ of the row to accumulate the charge generated in the photodiode in the charge accumulating section, and to output data corresponding to the accumulated charge amount in the charge accumulating section to the readout signal line $L1_n$.

The second row selecting section 30 selects any m2-th row in the light receiving section 10, and causes each pixel unit $P_{m2,n}$ of the row to accumulate the charge generated in the photodiode in the charge accumulating section, and to output data corresponding to the accumulated charge amount in the charge accumulating section to the readout signal line $L2_n$.

Here, m1 and m2 are each an integer not less than 1 and not more than M. The number of rows selected by each of the first row selecting section 20 and the second row selecting section 30 is arbitrary. However, the output of data is sequentially carried out with respect to every single row. Meanwhile, the first row selecting section 20 and the second row selecting section 30 select rows different from each other in the light receiving section 10.

The first readout section 40 is connected to N readout signal lines $L1_1$ to $L1_N$, and data output from each pixel unit $P_{m1,n}$ of the m1-th row in the light receiving section 10 selected by the first row selecting section 20 to the readout signal line $L1_n$ is input thereto, and data corresponding to an amount of charge generated in its photodiode of each pixel unit $P_{m1,n}$ of the m1-th row is output therefrom.

The second readout section 50 is connected to N readout signal lines $L2_1$ to $L2_N$, data output from each pixel unit $P_{m2,n}$ of the m2-th row in the light receiving section 10 selected by the second row selecting section 30 to the readout signal line $L2_n$ is input thereto, and data corresponding to an amount of charge generated in its photodiode of each pixel unit $P_{m2,n}$ of the m2-th row is output therefrom.

The control section 60 controls respective operations of the first row selecting section 20, the second row selecting section 30, the first readout section 40, and the second readout section 50, to control the entire operation of the solid-state image pickup device 1. The first row selecting section 20 and the first readout section 40, the second row selecting section 30 and the second readout section 50 are capable of operating in parallel with each other under the control of the control section 60.

Figure 2:
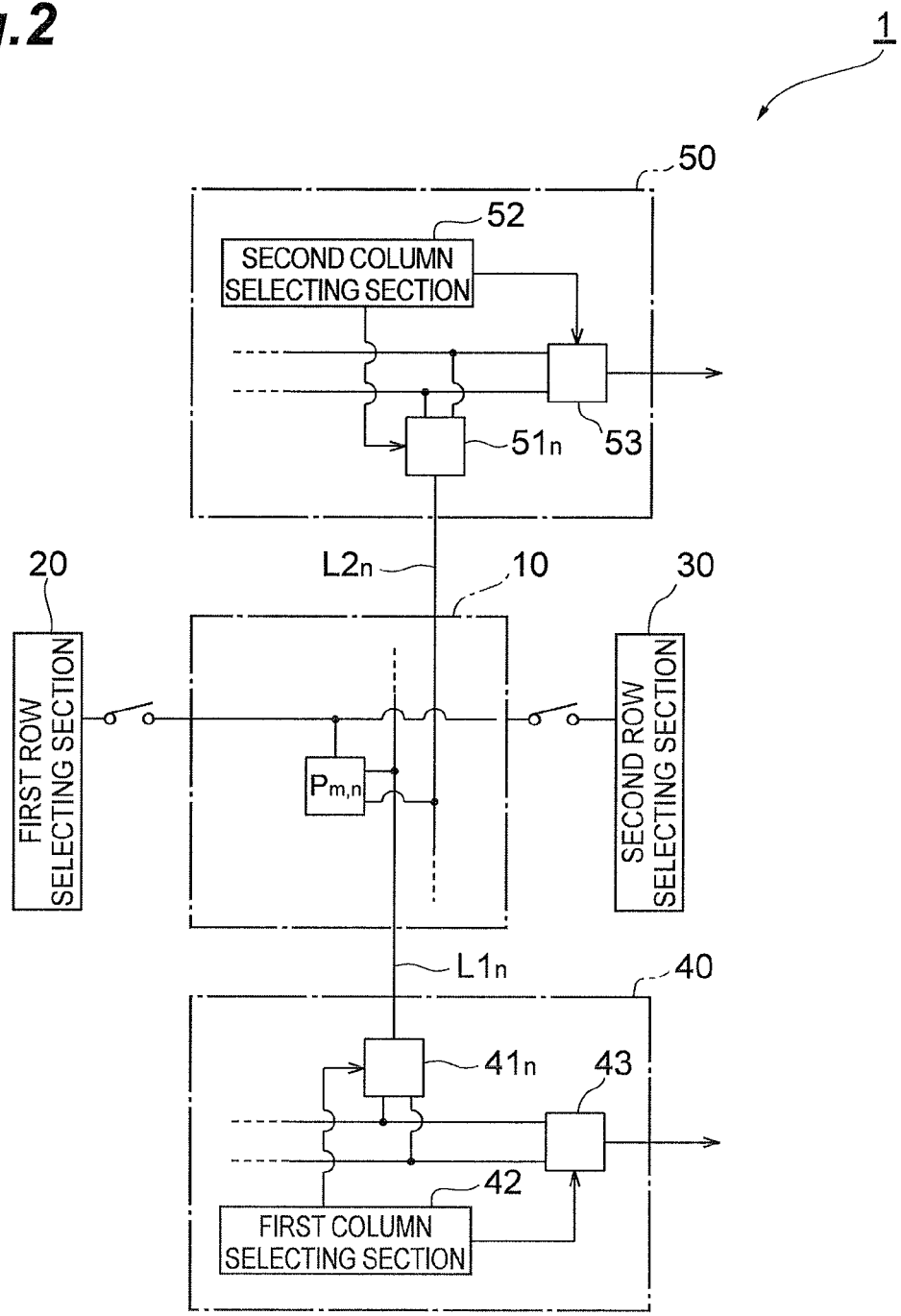
FIG. 2 is a diagram showing configurations of a first readout section 40 and a second readout section 50 of the solid-state image pickup device 1 according to the first embodiment.

FIG. 2 is a diagram showing configurations of the first readout section 40 and the second readout section 50 of the solid-state image pickup device 1 according to the first embodiment. In this figure, the pixel unit $P_{m,n}$ of the m-th row and the n-th column is shown as a representative of the M×N pixel units $P_{1,1}$ to $P_{M,N}$ in the light receiving section 10. Further, constitutional elements relating to the pixel unit $P_{m,n}$ are shown in each of the first readout section 40 and the second readout section 50.

The first readout section 40 includes N holding sections $41_1$ to $41_N$, a first column selecting section 42, and a difference arithmetic section 43. The N holding sections $41_1$ to $41_N$ have a common configuration. Each holding section $41_n$ is connected to M pixel units $P_{1,n}$ to $P_{M,n}$ of the n-th column in the light receiving section 10 via the readout signal line $L1_n$, and allows data output from the pixel unit $P_{m1,n}$ of the m1-th row selected by the first row selecting section 20 to the readout signal line $L1_n$ to be input thereto, to hold the data, and is capable of outputting the held data. Each holding section $41_n$ preferably allows data of signal components superimposed with noise components to be input thereto, to hold the data, and for allowing data of only noise components to be input thereto, to hold the data.

The N holding sections $41_1$ to $41_N$ are capable of sampling data at a same timing on the basis of various control signals received from the first column selecting section 42, to hold the sampled data, and sequentially output the held data. The difference arithmetic section 43 allows the data sequentially output from the respective N holding sections $41_1$ to $41_N$ to be input thereto, and subtracts the data of only noise components from the data of signal components superimposed with noise components, to output data corresponding to the signal components. The difference arithmetic section 43 may output the data corresponding to the signal components as analog data, or may have an AD conversion function to output digital data. In this way, the first readout section 40 is capable of outputting data corresponding to an amount of charge generated in the photodiode of each pixel unit $P_{m1,n}$ of the m1-th row.

The second readout section 50 includes N holding sections $51_1$ to $51_N$, a second column selecting section 52, and a difference arithmetic section 53. The N holding sections $51_1$ to $51_N$ have a common configuration. Each holding section $51_n$ is connected to M pixel units $P_{1,n}$ to $P_{M,n}$ of the n-th column in the light receiving section 10 via the readout signal line $L2_n$, and allows data output from the pixel unit $P_{m2,n}$ of the m2-th row selected by the second row selecting section 20 to the readout signal line $L2_n$ to be input thereto, to hold the data, and is capable of outputting the held data. Each holding section $51_n$ preferably allows data of signal components superimposed with noise components to be input thereto, to hold the data, and for allowing data of only noise components to be input thereto, to hold the data.

The N holding sections $51_1$ to $51_N$ are capable of sampling data at a same timing on the basis of various control signals received from the second column selecting section 52, to hold the sampled data, and sequentially output the held data. The difference arithmetic section 53 allows the data sequentially output from the respective N holding sections $51_1$ to $51_N$ to be input thereto, and subtracts the data of only noise components from the data of signal components superimposed with noise components, to output data corresponding to the signal components. The difference arithmetic section 53 may output the data corresponding to the signal components as analog data, or may have an AD conversion function to output digital data. In this way, the second readout section 50 is capable of outputting data corresponding to an amount of charge generated in its photodiode of each pixel unit $P_{m2,n}$ of the m2-th row.

Figure 3:
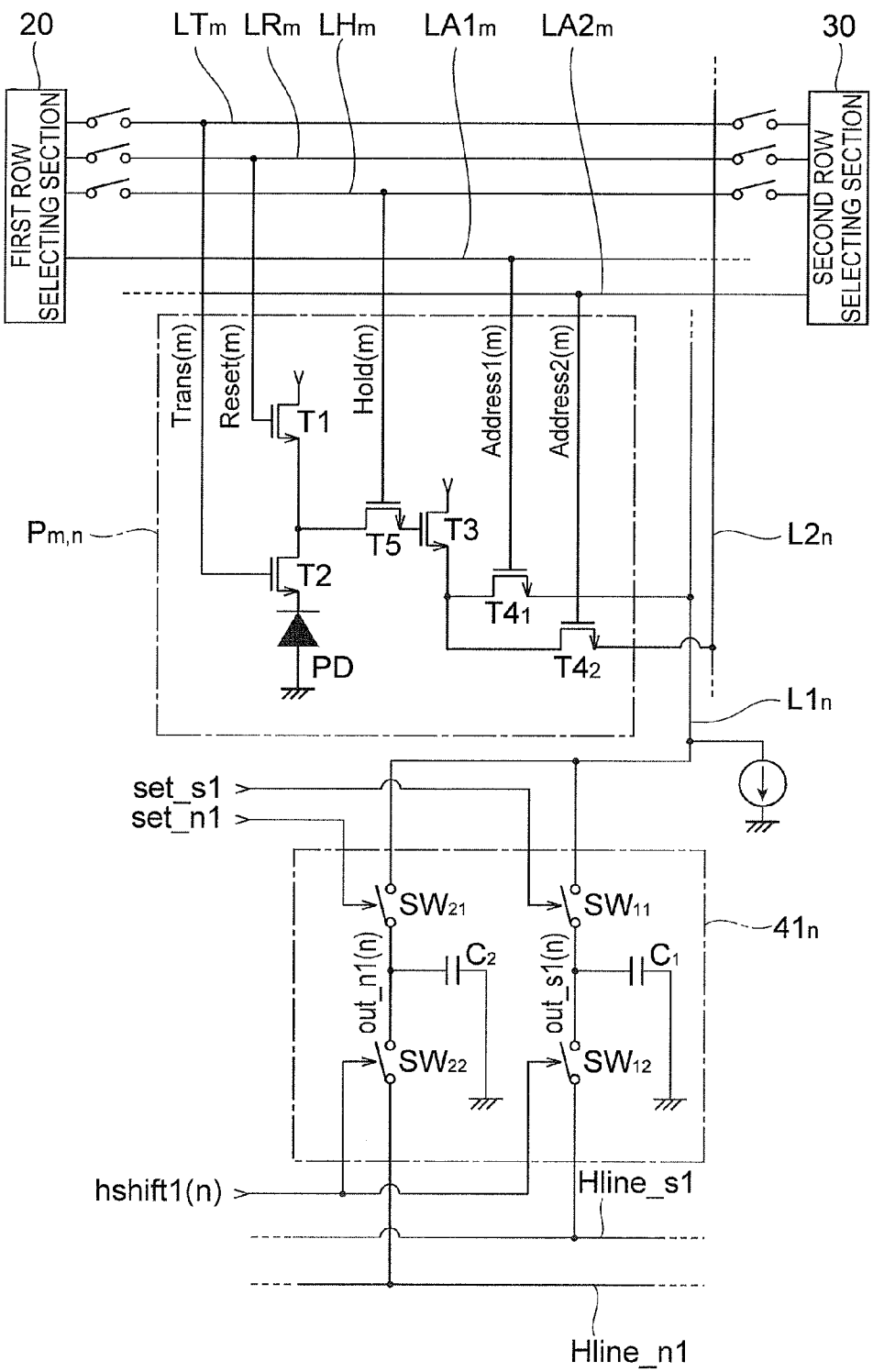
FIG. 3 is a diagram showing circuit configurations of a pixel unit $P_{m,n}$ and a holding section $41_n$ of the solid-state image pickup device 1 according to the first embodiment.

FIG. 3 is a diagram showing circuit configurations of the pixel unit $P_{m,n}$ and the holding section $41_n$ of the solid-state image pickup device 1 according to the first embodiment. In this figure as well, the pixel unit $P_{m,n}$ of the m-th row and the n-th column is shown as a representative of the M×N pixel units $P_{1,1}$ to $P_{M,N}$ in the light receiving section 10. Further, the holding section $41_n$ relating to the pixel unit $P_{m,n}$ is shown in the first readout section 40. In addition, the configuration of the holding section $51_n$ is the same as the configuration of the holding section $41_n$.

Each pixel unit $P_{m,n}$ is of the APS (Active Pixel Sensor) type, that includes a photodiode PD and 6 MOS transistors T1, T2, T3, $T4_1$, $T4_2$, and T5. As shown in this figure, the transistor T1, the transistor T2, and the photodiode PD are sequentially connected in series, and a reference voltage is input to the drain terminal of the transistor T1, and the anode terminal of the photodiode PD is grounded. The connection point between the transistor T1 and the transistor T2 is connected to the gate terminal of the transistor T3 via the transistor T5.

A reference voltage is input to the drain terminal of the transistor T3. The source terminal of the transistor T3 is connected to the respective drain terminals of the transistors $T4_1$ and $T4_2$. The source terminal of the transistor $T4_1$ of each pixel unit $P_{m,n}$ is connected to the readout signal line $L1_n$. The source terminal of the transistor $T4_2$ of each pixel unit $P_{m,n}$ is connected to the readout signal line $L2_n$. A constant current source is connected to the readout signal line $L1_n$ and the readout signal line $L2_n$, respectively.

The gate terminal of the transistor T2 for transfer in each pixel unit $P_{m,n}$ is connected to a control signal line $LT_m$, and a Trans1(m) signal output from the first row selecting section 20 or a Trans2(m) signal output from the second row selecting section 30 is input as a Trans(m) signal on the control signal line $LT_m$. The gate terminal of the transistor T1 for reset in each pixel unit $P_{m,n}$ is connected to a control signal line $LR_m$, and a Reset1(m) signal output from the first row selecting section 20 or a Reset2(m) signal output from the second row selecting section 30 is input as a Reset(m) signal on the control signal line. The gate terminal of the transistor T5 for hold in each pixel unit $P_{m,n}$ is connected to a control signal line $LH_m$, and a Hold1(m) signal output from the first row selecting section 20 or a Hold2(m) signal output from the second row selecting section 30 is input as a Hold(m) signal on the control signal line.

The gate terminal of the transistor $T4_1$ for output selection in each pixel unit $P_{m,n}$ is connected to a control signal line $LA1_m$, and an Address1(m) signal output from the first row selecting section 20 is input thereto. The gate terminal of the transistor $T4_2$ for output selection in each pixel unit $P_{m,n}$ is connected to a control signal line $LA2_m$, and an Address2(m) signal output from the second row selecting section 30 is input thereto. These control signals (a Reset(m) signal, a Trans(m) signal, a Hold(m) signal, an Address1(m) signal, and an Address2(m) signal) are input in common to the N pixel units $P_{m,1}$ to $P_{m,N}$ of the m-th row.

The control signal line $LT_m$, the control signal line $LR_m$, and the control signal line $LH_m$ are provided to every row, and the control signals (a Reset(m) signal, a Trans(m) signal, a Hold(m) signal) giving instructions for discharge from each of the junction capacitance section of the photodiode PD in each pixel unit $P_{m,n}$ of the m-th row and the charge accumulating section, and for charge accumulation by the charge accumulating section are transmitted therethrough. The first terminals of these control signal lines are connected to the first row selecting section 20 via switches. Further, the second terminals of these control signal lines are connected to the second row selecting section 30 via switches. The two switches provided to the both terminals of each of these control signal lines do not close at the same time, and at least one of these is always open. In addition, tri-state buffers may be used in place of these switches. In this case, the two tri-state buffers provided to the both terminals of each of these control signal lines are not brought into a conduction state at the same time, and at least one of these is always in a high-impedance state.

The control signal line $LA1_m$ and the control signal line $LA2_m$ are provided to every row, and the control signals (an Address1(m) signal, an Address2(m) signal) for giving instructions for data output to the readout signal line $L1_n$ or the readout signal line $L2_n$ in each pixel unit $P_{m,n}$ of the m-th row are transmitted therethrough. Each control signal line $LA1_m$ is connected to the first row selecting section 20. Each control signal line $LA2_m$ is connected to the second row selecting section 30. The Address1(m) signal and the Address2(m) signal are not raised to a high level simultaneously, and the transistor $T4_1$ and the transistor $T4_2$ do not move into an on-state simultaneously.

When the Reset(m) signal, the Trans(m) signal, and the Hold(m) signal are at a high level, the junction capacitance section of the photodiode PD is discharged, and further, a diffusion region (the charge accumulating section) connected to the gate terminal of the transistor T3 is discharged. When the Trans(m) signal is at a low level, the charge generated in the photodiode PD is accumulated in the junction capacitance section. When the Reset(m) signal is at a low level and the Trans(m) signal and the Hold(m) signal are at a high level, the charge accumulated in the junction capacitance section of the photodiode PD is transferred to the diffusion region (the charge accumulating section) connected to the gate terminal of the transistor T3 to be accumulated therein.

When the Address1($m$) signal is at a high level, data (data of signal components superimposed with noise components) corresponding to an amount of the charge accumulated in the diffusion region (the charge accumulating section) connected to the gate terminal of the transistor T3 is output to the readout signal line L1$_n$ via the transistor T4$_1$, to be input to the holding section 41$_n$ of the first readout section 40. That is, the transistor T4$_1$ operates as a first switch for outputting data corresponding to an accumulated charge amount in the charge accumulating section to the readout signal line L1$_n$. In addition, when the charge accumulating section is in a state of discharge, data of only noise components is output to the readout signal line L1$_n$ via the transistor T4$_1$.

When the Address2($m$) signal is at a high level, data (data of signal components superimposed with noise components) corresponding to an amount of the charge accumulated in the diffusion region (the charge accumulating section) connected to the gate terminal of the transistor T3 is output to the readout signal line L2$_n$ via the transistor T4$_2$, to be input to the holding section 51$_n$ of the second readout section 50. That is, the transistor T4$_2$ operates as a second switch for outputting data corresponding to an accumulated charge amount in the charge accumulating section to the readout signal line L2$_n$. In addition, when the charge accumulating section is in a state of discharge, data of only noise components is output to the readout signal line L2$_n$ via the transistor T4$_2$.

Each holding section 41$_n$ includes two capacitive elements C$_1$ and C$_2$, and four switches SW$_{11}$, SW$_{12}$, SW$_{21}$, and SW$_{22}$. In this holding section 41$_n$, the switch SW$_{11}$ and the switch SW$_{12}$ are connected in series to be provided between the readout signal line L1$_n$ and a wiring Hline_s1, and one terminal of the capacitive element C$_1$ is connected to the connection point between the switch SW$_{11}$ and the switch SW$_{12}$, and the other terminal of the capacitive element C$_1$ is grounded. Further, the switch SW$_{21}$ and the switch SW$_{22}$ are connected in series to be provided between the readout signal line L1$_n$ and a wiring Hline_n1, and one terminal of the capacitive element C$_2$ is connected to the connection point between the switch SW$_{21}$ and the switch SW$_{22}$, and the other terminal of the capacitive element C$_2$ is grounded.

In this holding section 41$_n$, the switch SW$_{11}$ opens and closes according to a level of a set_s1 signal supplied from the first column selecting section 42. The switch SW$_{21}$ opens and closes according to a level of a set_n1 signal supplied from the first column selecting section 42. The set_s1 signal and the set_n1 signal are input in common to the N holding sections 41$_1$ to 41$_N$. The switches SW$_{12}$ and SW$_{22}$ open and close according to a level of an hshift1($n$) signal supplied from the first column selecting section 42.

In this holding section 41$_n$, when the set_n1 signal is shifted from a high level to a low level and the switch SW$_{21}$ opens, the noise components output from the pixel unit P$_{m,n}$ to the readout signal line L1$_n$ are thereafter held as a voltage value out_n1(n) by the capacitive element C$_2$. When the set_s1 signal is shifted from a high level to a low level and the switch SW$_{11}$ opens, the signal components superimposed with noise components output from the pixel unit P$_{m,n}$ to the readout signal line L1$_n$ are thereafter held as a voltage value out_s1($n$) by the capacitive element C$_1$. Then, when the hshift1($n$) signal is raised to a high level, the switch SW$_{12}$ is closed to output the voltage value out_s1($n$) held by the capacitive element C$_1$ to the wiring Hline_s1, and the switch SW$_{22}$ is closed to output the voltage value out_n1($n$) held by the capacitive element C$_2$ to the wiring Hlinen1. A difference between these voltage value outs 1($n$) and voltage value out_n1($n$) represents a voltage value corresponding to an amount of charge generated in its photodiode PD of the pixel unit P$_{m,n}$.

Figure 4:
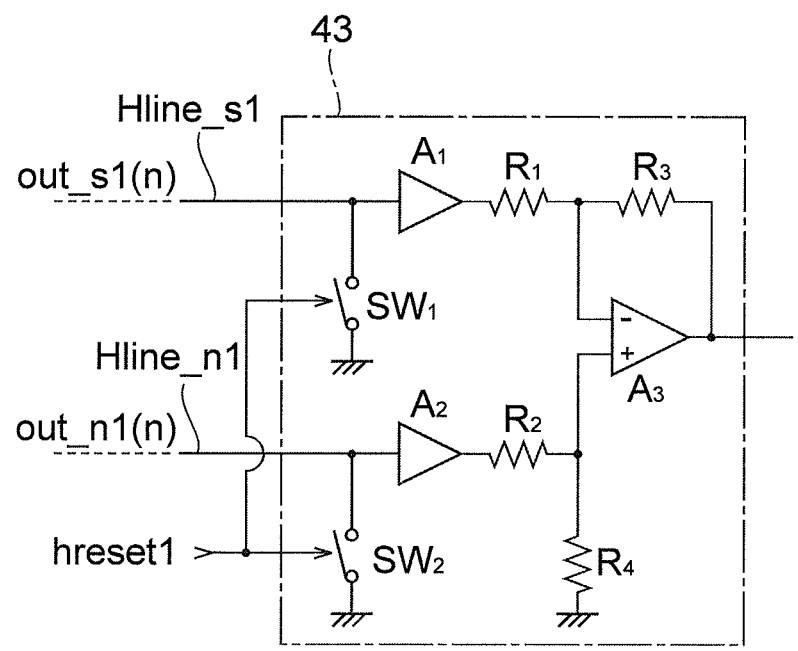
FIG. 4 is a diagram showing a circuit configuration of a difference arithmetic section 43 of the solid-state image pickup device 1 according to the first embodiment.

FIG. 4 is a diagram showing a circuit configuration of the difference arithmetic section 43 of the solid-state image pickup device 1 according to the first embodiment. In addition, the configuration of the difference arithmetic section 53 is the same as the configuration of the difference arithmetic section 43. As shown in this figure, the difference arithmetic section 43 includes amplifiers A$_1$ to A$_3$, switches SW$_1$ and SW$_2$, and resistors R$_1$ to R$_4$. The inverting input terminal of the amplifier A$_3$ is connected to the output terminal of the buffer amplifier A$_1$ via the resistor R$_1$, and is connected to its own output terminal via the resistor R$_3$. The non-inverting input terminal of the amplifier A$_3$ is connected to the output terminal of the buffer amplifier A$_2$ via the resistor R$_2$, and is connected to a grounding potential via the resistor R$_4$. The input terminal of the buffer amplifier A$_1$ is connected to the N holding sections 41$_1$ to 41$_N$ via the wiring Hline_s1, and is connected to a grounding potential via the switch SW$_1$. The input terminal of the buffer amplifier A$_2$ is connected to the N holding sections 41$_1$ to 41$_N$ via the wiring Hline_n1, and is connected to a grounding potential via the switch SW$_2$.

The switches SW$_1$ and SW$_2$ in the difference arithmetic section 43 are controlled by an hreset1 signal supplied from the first column selecting section 42 to carry out an opening and closing operation. When the switch SW$_1$ is closed, the voltage value input to the input terminal of the buffer amplifier A$_1$ is reset. When the switch SW$_2$ is closed, the voltage value input to the input terminal of the buffer amplifier A$_2$ is reset. When the switches SW$_1$ and SW$_2$ are open, the voltage values out_s1($n$) and out_n1($n$) output to the wirings Hline_s1 and Hline_n1 from any holding section 41$_n$ among the N holding sections 41$_1$ to 41$_N$ are input to the input terminals of the buffer amplifiers A$_1$ and A$_2$. Assuming that the respective gains of the buffer amplifiers A$_1$ and A$_2$ are 1, and the respective resistance values of the four resistors R$_1$ to R$_4$ are equal to one another, a voltage value output from the output terminal of the difference arithmetic section 43 represents a difference between the voltage values respectively input via the wiring Hline_s1 and the wiring Hline_n1, that is the value from which noise components are eliminated.

Figure 5:
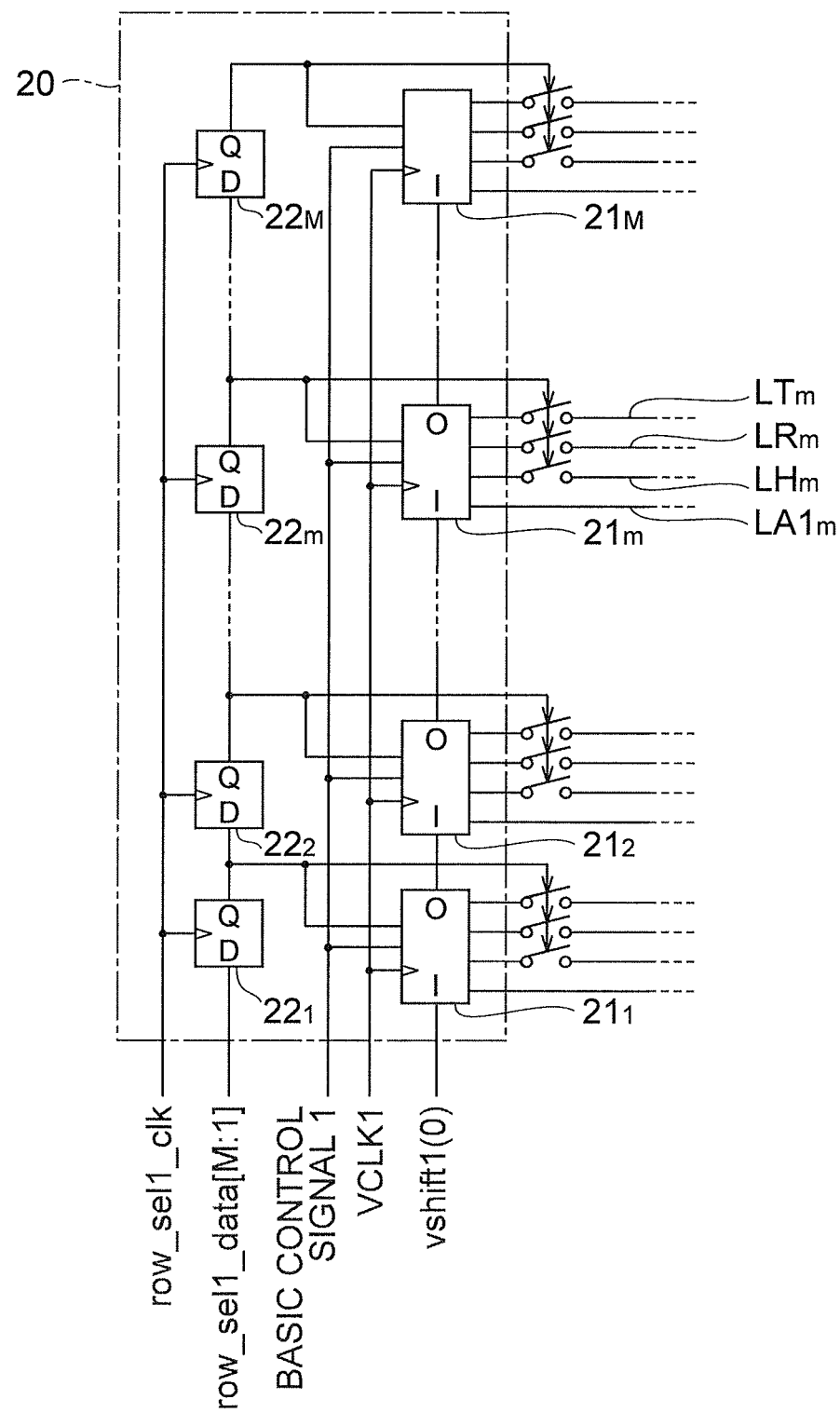
FIG. 5 is a diagram showing a configuration of a first row selecting section 20 of the solid-state image pickup device 1 according to the first embodiment.

FIG. 5 is a diagram showing a configuration of the first row selecting section 20 of the solid-state image pickup device 1 according to the first embodiment. As shown in this figure, the first row selecting section 20 includes M control signal generating circuits 21$_1$ to 21$_M$ composing a first shift register, and M latch circuits 22$_1$ to 22$_M$ composing a second shift register.

The M control signal generating circuits 21$_1$ to 21$_M$ have a common configuration, and these are cascade-connected sequentially. That is, an input terminal I of each control signal generating circuit 21$_m$ is connected to an output terminal O of a control signal generating circuit 21$_{m-1}$ at the previous stage (here, m is an integer not less than 2 and not more than M). A vshift1(0) signal at a high level at a timing of instruction from a clock VCLK1 and at a low level thereafter is input to the input terminal I of the control signal generating circuit 21$_1$ at the first stage.

Each control signal generating circuit $21_m$ operates in synchronization with the clock VCLK1, and when a basic control signal 1 is input, and data row_sel1_data[m] held by a corresponding latch circuit $22_m$ is at a high level, the control signal generating circuit $21_m$ outputs the Reset1(m) signal, the Trans1(m) signal, the Hold1(m) signal, and the Address1(m) signal. When the data row_sel1_data[m] held by a corresponding latch circuit $22_m$ is at a low level, each control signal generating circuit $21_m$ does not output the Reset1(m) signal, the Trans1(m) signal, the Hold1(m) signal, and the Address1(m) signal.

The M latch circuits $22_1$ to $22_M$ are each a D flip-flop, and these are sequentially cascade-connected. That is, an input terminal D of each latch circuit $22_m$ is connected to an output terminal Q of a latch circuit $22_{m-1}$ at the previous stage (here, m is an integer not less than 2 and not more than M). M-bit data row_sel1_data[M:1] are serial-input to the input terminal D of the latch circuit $22_1$ at the first stage. Each latch circuit $22_m$ operates in synchronization with a clock row_sel1_clk, to be capable of holding the data row_sel1_data[m].

Each latch circuit $22_m$ provides the holding data row_sel1_data[m] to a corresponding control signal generating circuit $21_m$. Further, each latch circuit $22_m$ provides the holding data row_sel1_data[m] to the switches provided to the respective first terminals of the control signal line $LT_m$, the control signal line $LR_m$, and the control signal line $LH_m$, to control opening and closing operations of these switches. When the data row_sel1_data[m] is at a high level, these switches are closed.

The first row selecting section 20 is provided with a vshift1(0) signal, a clock VCLK1, a basic control signal 1, M-bit data row_sel1_data[M:1], and a clock row_sel1_clk from the control section 60.

In addition, the second row selecting section 30 has the same configuration as that of the first row selecting section 20, and includes M control signal generating circuits $31_1$ to $31_M$ composing a first shift register, and M latch circuits $32_1$ to $32_M$ composing a second shift register, and these are configured in the same way as the first row selecting section 20.

Figure 6:
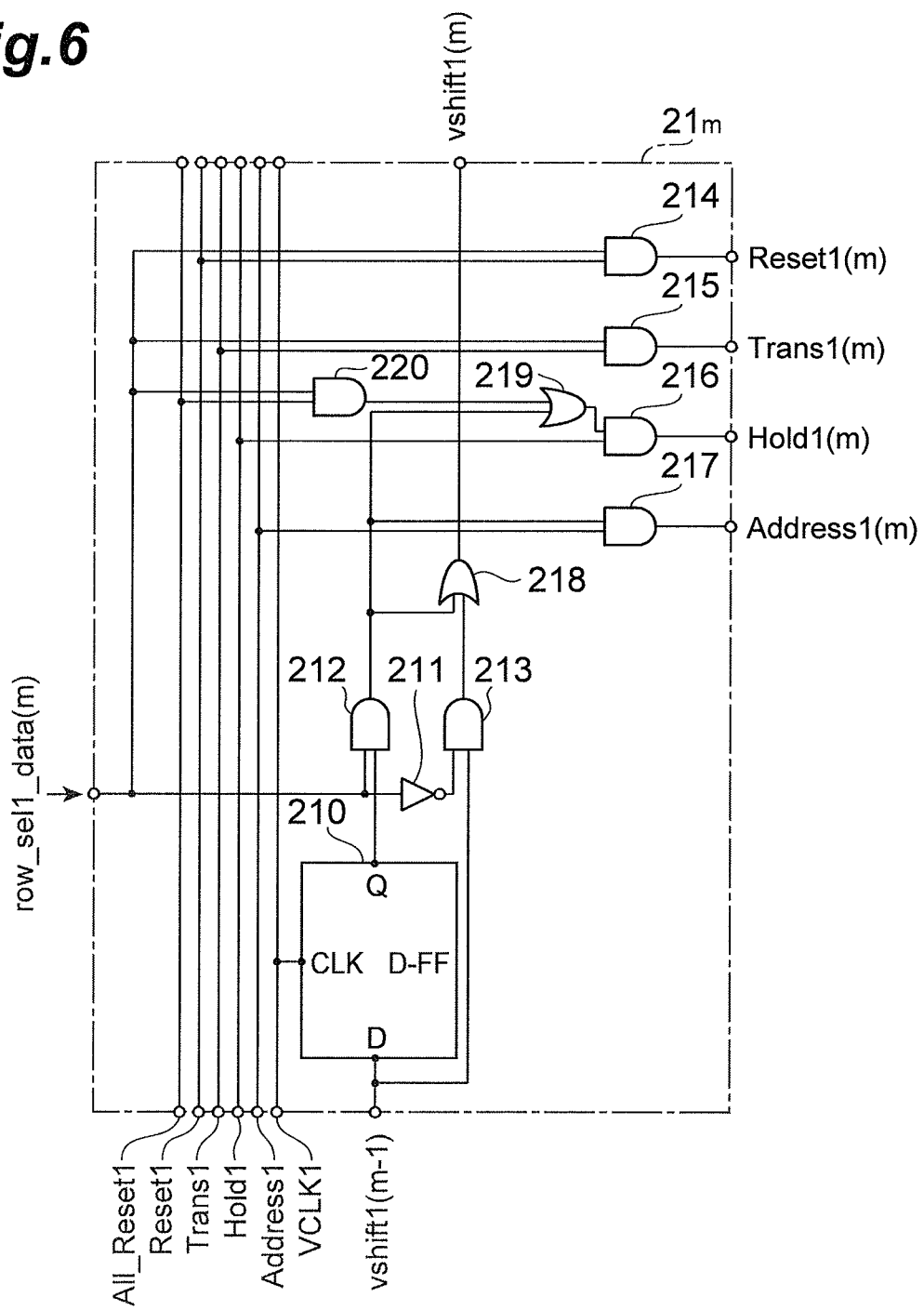
FIG. 6 is a diagram showing a configuration of a control signal generating circuit $21_m$ of the first row selecting section 20 of the solid-state image pickup device 1 according to the first embodiment.

FIG. 6 is a diagram showing a configuration of the control signal generating circuit $21_m$ of the first row selecting section 20 of the solid-state image pickup device 1 according to the first embodiment. Each control signal generating circuit $21_m$ includes a D flip-flop 210, a NOT circuit 211, AND circuits 212 to 217, and 220, and OR circuits 218 and 219. An All_reset1 signal, a Reset1 signal, a Trans1 signal, a Hold1 signal, and an Address1 signal are input as the basic control signal 1 described in FIG. 5 to each control signal generating circuit $21_m$.

The D flip-flop 210 of each control signal generating circuit $21_m$ allows a vshift1(m-1) signal output from a control signal generating circuit $21_{m-1}$ at the previous stage to be input thereto, to hold the data at a timing of instruction from the clock VCLK1, and outputs the held data.

The AND circuit 212 of each control signal generating circuit $21_m$ allows the data row_sel1_data[m] output from a corresponding latch circuit $22_m$ to be input thereto, and allows data output from the D flip-flop 210 as well to be input thereto, and outputs data of logical conjunction of these.

The AND circuit 213 of each control signal generating circuit $21_m$ allows data that the data row_sel1_data[m] output from a corresponding latch circuit $22_m$ is logic-inverted by the NOT circuit 211 to be input thereto, and allows data of a vshift1(m-1) signal output from a control signal generating circuit $21_{m-1}$ at the previous stage as well to be input thereto, and outputs data of logical conjunction of these.

The OR circuit 218 of each control signal generating circuit $21_m$ allows respective data from the AND circuit 212 and the AND circuit 213 to be input thereto, and outputs data of logical disjunction of these as a vshift1(m) signal.

The AND circuit 214 of each control signal generating circuit $21_m$ allows data row_sel1_data[m] output from a corresponding latch circuit $22_m$ to be input thereto, and allows data of the Reset1 signal to be input thereto, and outputs data of logical conjunction of these as a Reset1(m) signal.

The AND circuit 215 of each control signal generating circuit $21_m$ allows data row_sel1_data[m] output from a corresponding latch circuit $22_m$ to be input thereto, and allows data of the Trans1 signal to be input thereto, and outputs data of logical conjunction of these as a Trans1(m) signal.

The AND circuit 216 of each control signal generating circuit $21_m$ allows data row_sel1_data[m] output from a corresponding latch circuit $22_m$, and data of logical disjunction (output data from the OR circuit 219) of data of logical conjunction of the All_reset1 signal (output data from the AND circuit 220) and output data from the AND circuit 212 to be input thereto, and allows data of the Hold1 signal to be input thereto, and outputs data of logical conjunction of these as a Hold1(m) signal.

The AND circuit 217 of each control signal generating circuit $21_m$ allows data of the Address1 signal to be input thereto, and allows output data from the AND circuit 212 as well to be input thereto, and outputs data of logical conjunction of these as an Address1(m) signal.

In the first row selecting section 20 with such a configuration, only when data held in an m1-th latch circuit $22_{m1}$ among the M latch circuits $22_1$ to $22_M$ is at a high level, a control signal generating circuit $21_{m1}$ corresponding thereto is capable of outputting control signals (a Reset(m) signal, a Trans(m) signal, a Hold(m) signal) to the control signal line via the switch or the tri-state buffer provided to the first terminal of the m1-th row control signal line, and outputting an Address1(m) signal as well. The control signals output from each control signal generating circuit $21_m$ are the Reset1(m) signal, the Trans1(m) signal, and the Hold1(m) signal. However, when these signals are output to the control signal line via the switches or the tri-state buffers provided to the first terminals of the control signal lines, for example, $LR_m$, $LT_m$, and $LH_m$ of the m-th row, these signals are respectively handled as Reset(m), Trans(m), and Hold(m).

Further, in the first row selecting section 20 with such a configuration, a control signal generating circuit corresponding to a latch circuit whose holding data is at a low level among the M latch circuits $22_1$ to $22_M$ is capable of outputting the vshift1 signal reaching from the previous stage immediately to the subsequent stage without outputting a control signal. That is, only latch circuits whose holding data are at high level among the M latch circuits $22_1$ to $22_M$ compose a substantive shift register. Therefore, the first row selecting section 20 is capable of sequentially outputting control signals at a constant time interval (a period of the clock VCLK1) to rows corresponding to latch circuits whose holding data are at high level among the M latch circuits $22_1$ to $22_M$.

As already described, the first row selecting section 20 and the second row selecting section 30 select rows different from each other in the light receiving section 10. Further, the first row selecting section 20 and the first readout section 40, and the second row selecting section 30 and the second readout section 50 are capable of operating in parallel with each other. Hereinafter, a case is assumed that an optical signal reaches each of the pixel unit $P_{x1,y1}$ of the x1-th row and the y1-th column and the pixel unit $P_{x2,y2}$ of the x2-th row and the y2-th column among the M×N pixel units $P_{1,1}$ to $P_{M,N}$ in the light receiving section 10.

In this case, the first row selecting section 20 sequentially selects (M-2) rows except for the x1-th row and the x2-th row in the light receiving section 10, and causes each pixel unit of each row to accumulate charge generated in its photodiode PD in its charge accumulating section, to output data corresponding to an accumulated charge amount in the charge accumulating section to the readout signal line $L1_n$ from the transistor $T4_1$. The first readout section 40 allows data output to the readout signal line $L1_n$ from each pixel unit of each row (except for the x1-th row and the x2-th row) in the light receiving section 10 selected by the first row selecting section 20 to be input thereto, and outputs data corresponding to an amount of charge generated in its photodiode PD of each pixel unit. Image pickup can be performed by obtaining these data. However, image data cannot be obtained from the x1-th row and the x2-th row, which maybe be interpolated from image data of the neighboring rows.

Further, the second row selecting section 30 sequentially selects the x1-th row and the x2-th row in the light receiving section 10, and causes each pixel unit of each row to accumulate charge generated in its photodiode PD in the charge accumulating section, and outputs data corresponding to an accumulated charge amount in the charge accumulating section to the readout signal line $L2_n$ from the transistor $T4_2$. The second readout section 50 allows data output to the readout signal line $L2_n$ from each pixel unit of the x1-th row and the x2-th row in the light receiving section 10 selected by the second row selecting section 30 to be input thereto, and outputs data corresponding to an amount of charge generated in its photodiode PD of each pixel unit. In addition, the second readout section 50 may output only data of the pixel unit $P_{x1,y1}$ of the y1-th column with respect to the x1-th row, and may output only data of the pixel unit $P_{x2,y2}$ of the y2-th column with respect to the x2-th row. Optical communication data can be acquired by obtaining these data.

Figure 7:
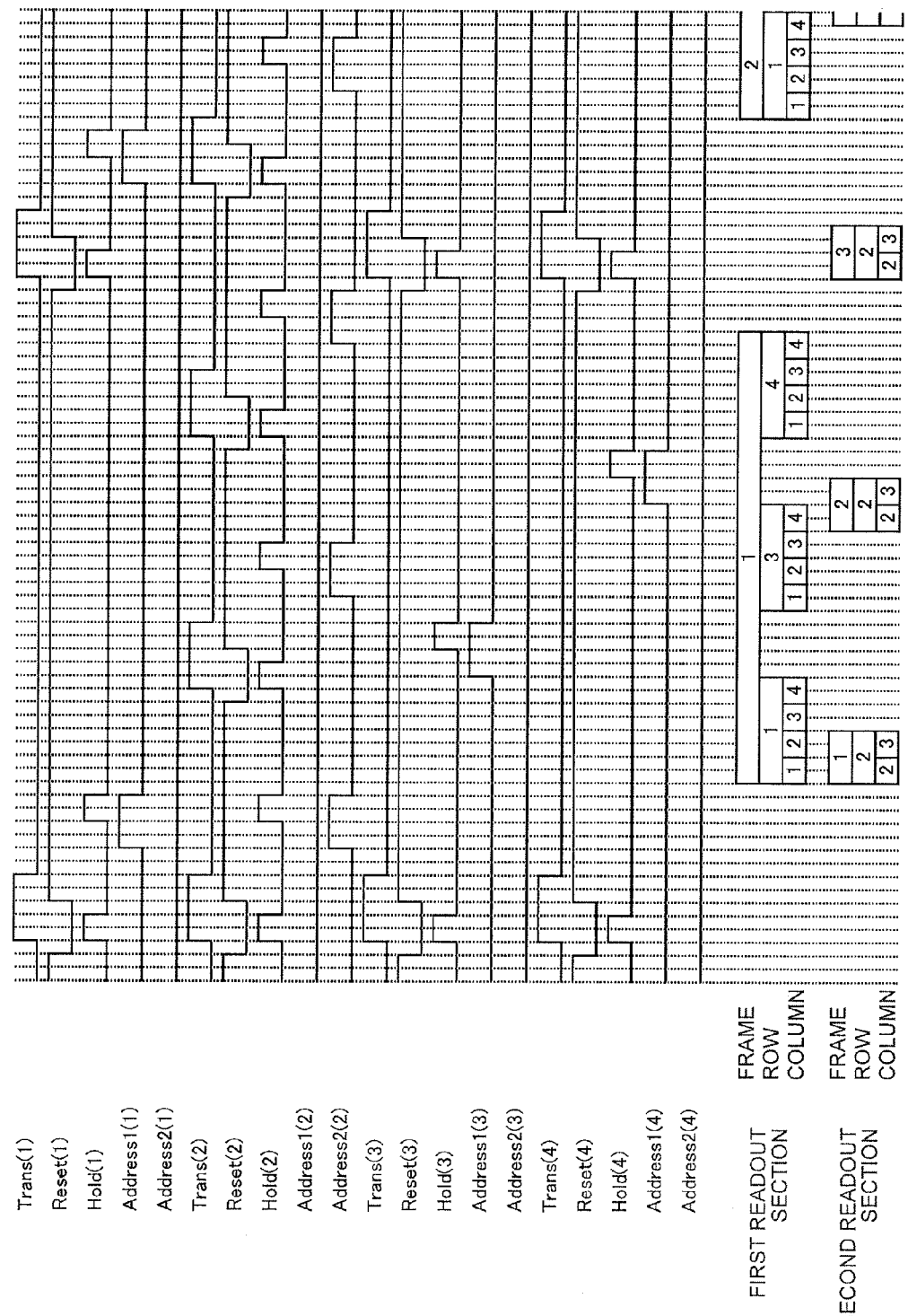
FIG. 7 is a timing chart showing an example of the operation of the solid-state image pickup device 1 according to the first embodiment.

FIG. 7 is a timing chart showing an example of the operation of the solid-state image pickup device 1 according to the first embodiment. Here, to simplify the explanation, it is set that M=N=4, and it is assumed that an optical signal reaches each of the pixel unit $P_{2,2}$ of the second row and the second column and the pixel unit $P_{2,3}$ of the second row and the third column, and the second readout section 50 outputs only the data of the two pixel units $P_{2,2}$ and $P_{2,3}$. In this case, in the first row selecting section 20, high-level values are respectively held in the latch circuits $22_1$, $22_3$, and $22_4$, and a low level value is held in the latch circuit $22_2$. Further, in the second row selecting section 30, low-level values are respectively held in the latch circuits $32_1$, $32_3$, and $32_4$, and a high-level value is held in the latch circuit $32_2$. It is assumed that these settings are configured before readout. When a same region is read out continuously, there is no need to reset. When a region to be read out is changed, resetting is configured during a time between a frame and a frame.

This figure shows, in order from the top, control signals (Trans(1), Reset(1) signal, Hold(1) signal, Address1(1) signal, Address2(1) signal) provided to the four pixel units $P_{1,1}$ to $P_{1,4}$ of the first row, control signals (Trans(2), Reset(2) signal, Hold(2) signal, Address1(2) signal, Address2(2) signal) provided to the four pixel units $P_{2,1}$ to $P_{2,4}$ of the second row, control signals (Trans(3), Reset(3) signal, Hold(3) signal, Address1(3) signal, Address2(3) signal) provided to the four pixel units $P_{3,1}$ to $P_{3,4}$ of the third row, control signals (Trans (4), Reset(4) signal, Hold(4) signal, Address1(4) signal, Address2(4) signal) provided to the four pixel units $P_{4,1}$ to $P_{4,4}$ of the fourth row, the contents (frames, rows, columns) of data output from the first readout section 40, and the contents (frames, rows, columns) of data output from the second readout section 50.

As shown in this figure, in each pixel unit of the first row, the third row, and the fourth row selected by the first row selecting section 20, charge generated in its photodiode is transferred to be accumulated in its charge accumulating section at the same timing. Then, the first row, the third row, and the fourth row are sequentially selected by the first row selecting section 20, and from the first readout section 40, respective data of the respective pixel units $P_{1,1}$ to $P_{1,4}$ of the first row are sequentially output, and next, respective data of the respective pixel units $P_{3,1}$ to $P_{3,4}$ of the third row are sequentially output. Further, next, respective data of the respective pixel units $P_{4,1}$ to $P_{4,4}$ of the fourth row are sequentially output, to obtain image data of one frame. Data of each row in each frame is output at a constant time interval. On the other hand, the respective pixel units of the third row are selected by the second row selecting section 30, and respective data of the two pixel units $P_{2,2}$ and $P_{2,3}$ of the second row are sequentially output from the second readout section 50, to obtain communication data.

A more concrete example is described as follows. Here, it is assumed that a camera equipped with a solid-state image pickup device of M=480 and N=640 is mounted on a vehicle, and image pickup of a view in front of the vehicle is performed by the camera. It is assumed that a blinking signal generated from a brake lamp LED of the front vehicle (which is assumed as information such as a level of stepping on the accelerator/brake of the front vehicle or a distance from left-turn/right-turn) reaches a certain pixel unit of a certain row in the light receiving section 10. Further, it is assumed that a blinking signal generated from a traffic signal LED (which is assumed as information such as a type of red signal/green signal or a waiting time/a traffic jam) reaches a certain pixel unit of another certain row in the light receiving section 10. That is, image pickup is performed with the other 478 rows by receiving optical signals reaching the two rows among the 480 rows in the light receiving section 10. Further, it is assumed that a transfer time is a period for reading out 40 pixels, and a pixel rate is 10 MHz.

A frame rate when data of the respective pixel units on the 478 rows selected by the first row selecting section 20 are output from the first readout section 40 is obtained by the following calculating formula (1). On the other hand, a frame rate when data of the respective pixel units of the two rows selected by the second row selecting section 30 are output from the second readout section 50 is obtained by the following calculating formula (2).

$$10 \text{ MHz}/478 \times (640+40) = 31.7 \text{ fps} \quad (1)$$

$$10 \text{ MHz}/2 \times (640+40) = 7.35 \text{ kfps} \quad (2)$$

In this way, image pickup at a usual frame rate of 30 fps is possible by the first row selecting section 20 and the first readout section 40. At this time, two defective lines are produced. However, it suffices to interpolate the defective lines from the neighboring rows. Further, because a data receiving rate of fast readout for only two rows by the second row selecting section 30 and the second readout section 50 is greater than or equal to 7 kfps, it is possible to receive data of optical signals at a rate up to approximately 3.5 kfps. In addition, provided that only the data of specific pixel units of the two rows receiving optical signals are output by the second readout section 50, further speeding-up is possible.

As described above, in comparison with a usual solid-state image pickup device, one transistor for output selection is merely added to each pixel unit $P_{m,n}$, and one control signal line is merely added to each row and one readout signal line is merely added to each column in the light receiving section 10 in the solid-state image pickup device 1 according to the present embodiment. Therefore, the solid-state image pickup device 1 according to the present embodiment is capable of suppressing an increase in region area per pixel unit and a reduction in aperture ratio in the light receiving section 10.

Further, in the solid-state image pickup device 1 according to the present embodiment, data of the pixel units of the rows in the light receiving section 10 selected by the first row selecting section 20 are output by the first readout section 40 to obtain image pickup data, and data of the pixel units of the rows in the light receiving section 10 selected by the second row selecting section 30 are output by the second readout section 50 to obtain communication data. Therefore, because the solid-state image pickup device 1 according to the present embodiment is capable of freely selecting the rows by the first row selecting section 20 and the second row selecting section 30 respectively even when the number of optical signal receiving regions in the light receiving section 10 varies, it is possible to flexibly respond to the variation in the number of optical signal receiving regions.

In addition, the solid-state image pickup device 1 according to the present embodiment is, as described so far, capable of obtaining image pickup data by the first row selecting section 20 and the first readout section 40, and obtaining communication data by the second row selecting section 30 and the second readout section 50. However, other modes of usage as well are possible. For example, the solid-state image pickup device 1 according to the present embodiment may select all the rows in the light receiving section 10 by the first row selecting section 20, and may output the data of all the pixel units by the first readout section 40. In this case, the solid-state image pickup device 1 is capable of performing image pickup, which is the same as that by a usual solid-state image pickup device.

Figure 8:
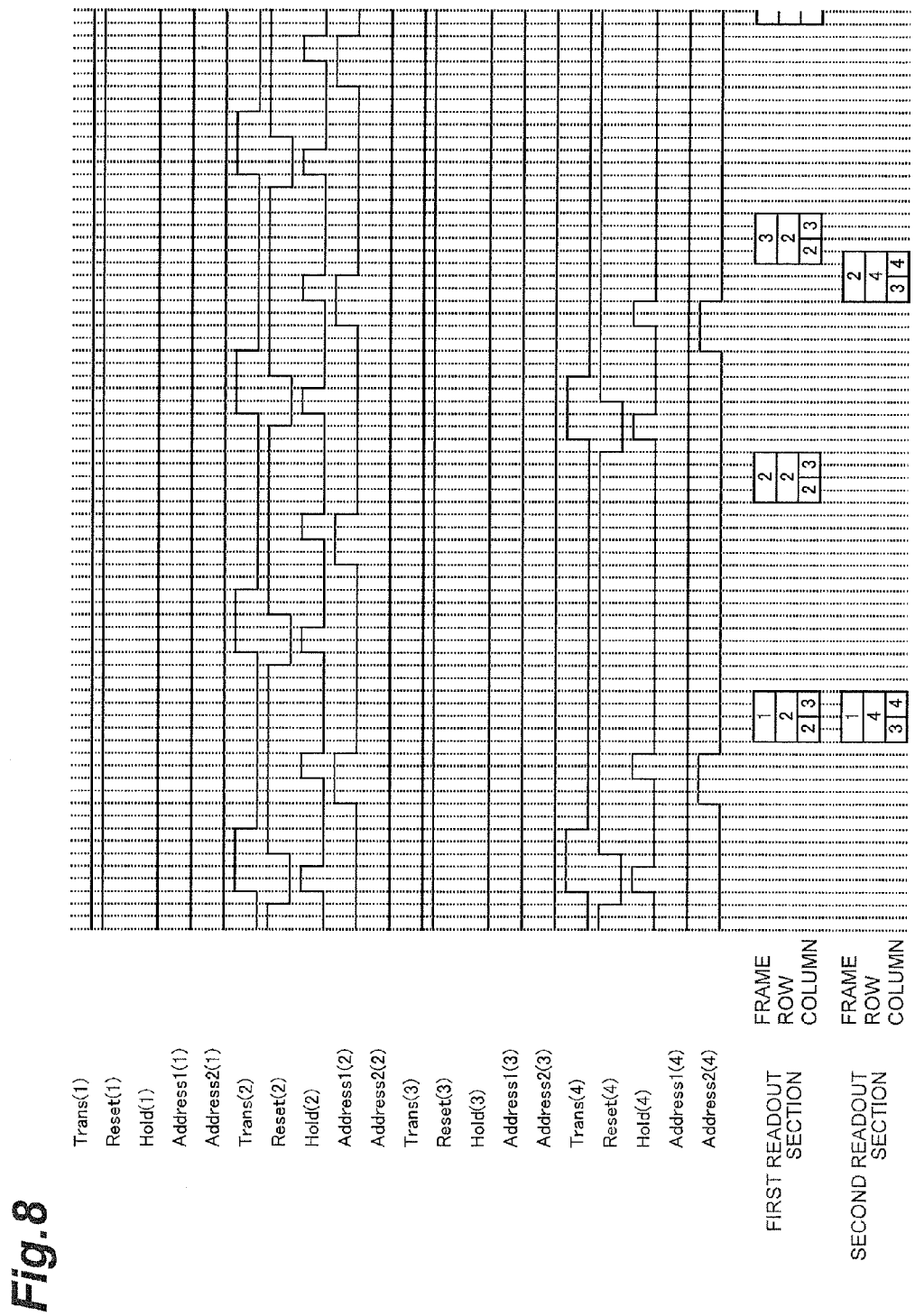
FIG. 8 is a timing chart showing another example of the operation of the solid-state image pickup device 1 according to the first embodiment.

Further, for example, the solid-state image pickup device 1 according to the present embodiment may obtain communication data by both the first row selecting section 20 and the first readout section 40, and the second row selecting section 30 and the second readout section 50 as a timing chart is shown in FIG. 8. In the example shown in this figure, the solid-state image pickup device 1 obtains respective communication data of the two pixel units $P_{2,2}$ and $P_{2,3}$ of the second row by the first row selecting section 20 and the first readout section 40, and obtains respective communication data of the two pixel units $P_{4,3}$ and $P_{4,4}$ of the fourth row by the second row selecting section 30 and the second readout section 50. In this case, a data receiving rate by the first row selecting section 20 and the first readout section 40 and a data receiving rate by the second row selecting section 30 and the second readout section 50 may be made different from each other.

Figure 9:
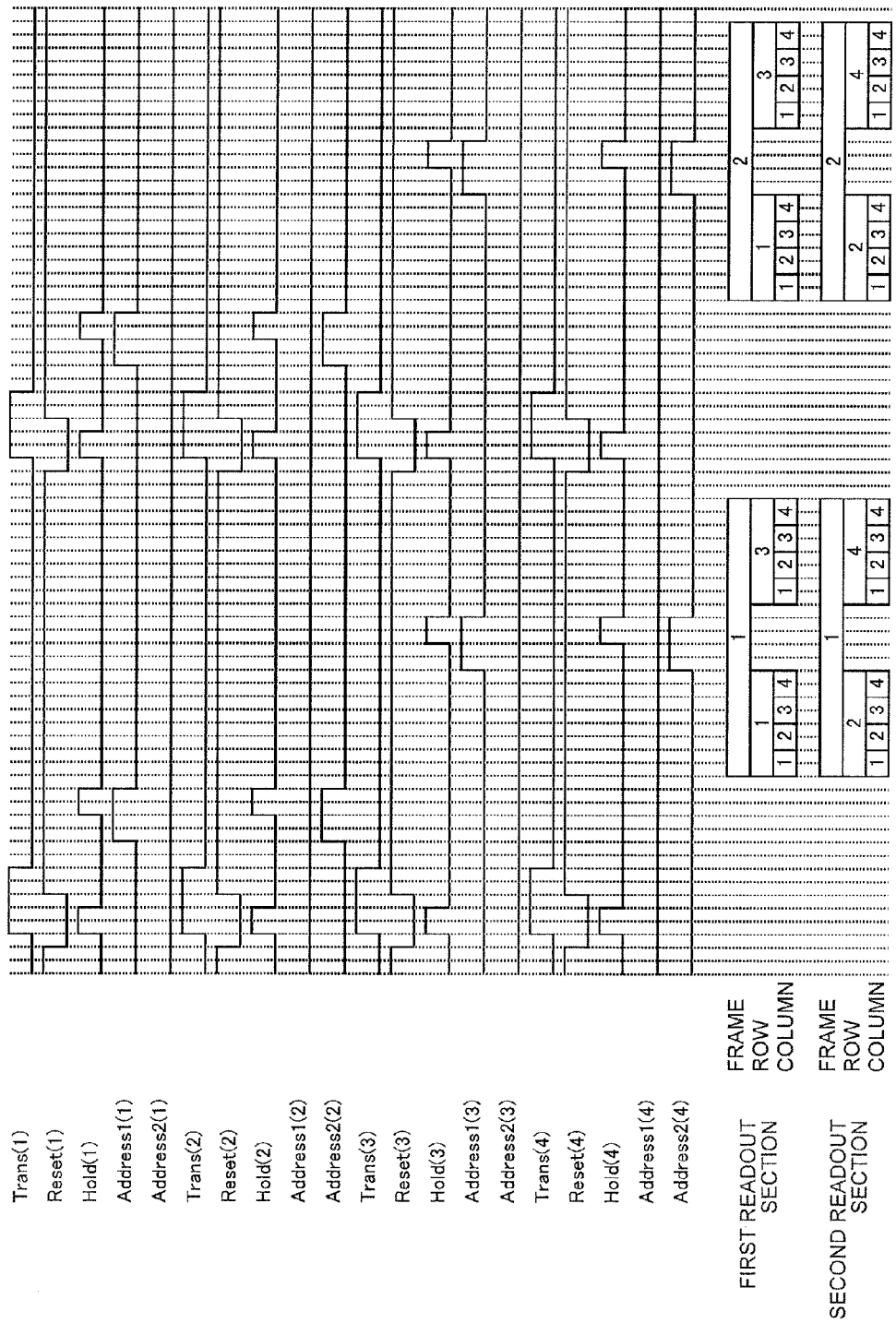
FIG. 9 is a timing chart showing yet another example of the operation of the solid-state image pickup device 1 according to the first embodiment.

Further, for example, the solid-state image pickup device 1 according to the present embodiment may obtain image data by both the first row selecting section 20 and the first readout section 40, and the second row selecting section 30 and the second readout section 50 as a timing chart is shown in FIG. 9. In the example shown in this figure, the solid-state image pickup device 1 obtains image data of the respective pixel units of the first row and the third row by the first row selecting section 20 and the first readout section 40, and obtains image data of the respective pixel units of the second row and the fourth row by the second row selecting section 30 and the second readout section 50. In this case, a frame rate by the first row selecting section 20 and the first readout section 40 and a frame rate by the second row selecting section 30 and the second readout section 50 may be made different from each other.

Second Embodiment

Figure 10:
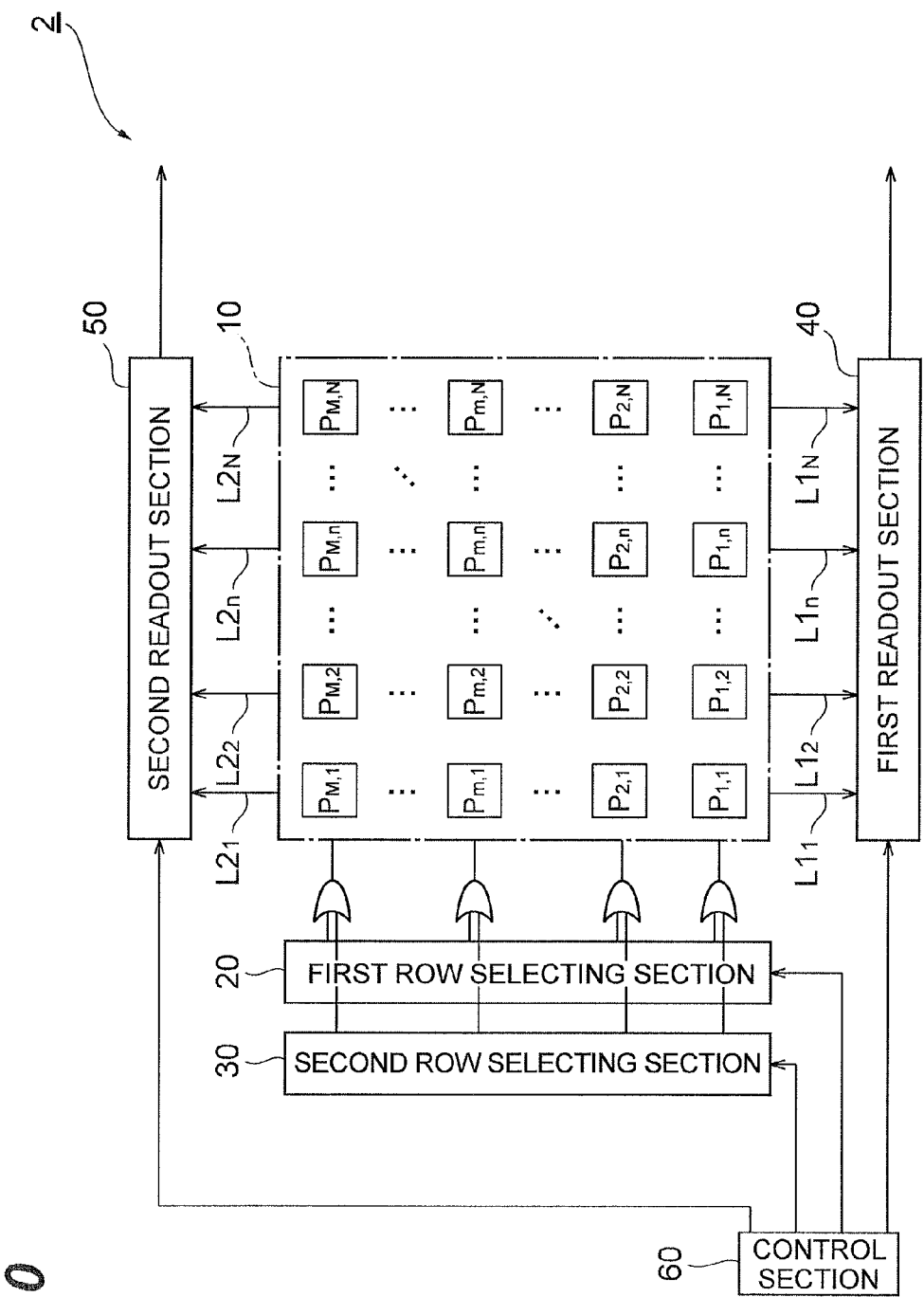
FIG. 10 is a diagram showing a schematic configuration of a solid-state image pickup device 2 according to a second embodiment.

FIG. 10 is a diagram showing a schematic configuration of a solid-state image pickup device 2 according to a second embodiment. The solid-state image pickup device 2 shown in this figure includes the light receiving section 10, the first row selecting section 20, the second row selecting section 30, the first readout section 40, the second readout section 50, and the control section 60. These respective components have the same configurations as those of the constitutional elements of the solid-state image pickup device 1 according to the first embodiment.

The first row selecting section 20 and the second row selecting section 30 are disposed so as to have the light receiving section 10 therebetween in the first embodiment. However, the first row selecting section 20 and the second row selecting section 30 are disposed on one side of the light receiving section 10 in the second embodiment. Further, in the second embodiment, control signals respectively output from the first row selecting section 20 and the second row selecting section 30 are output to control signal lines via the OR circuits.

Figure 11:
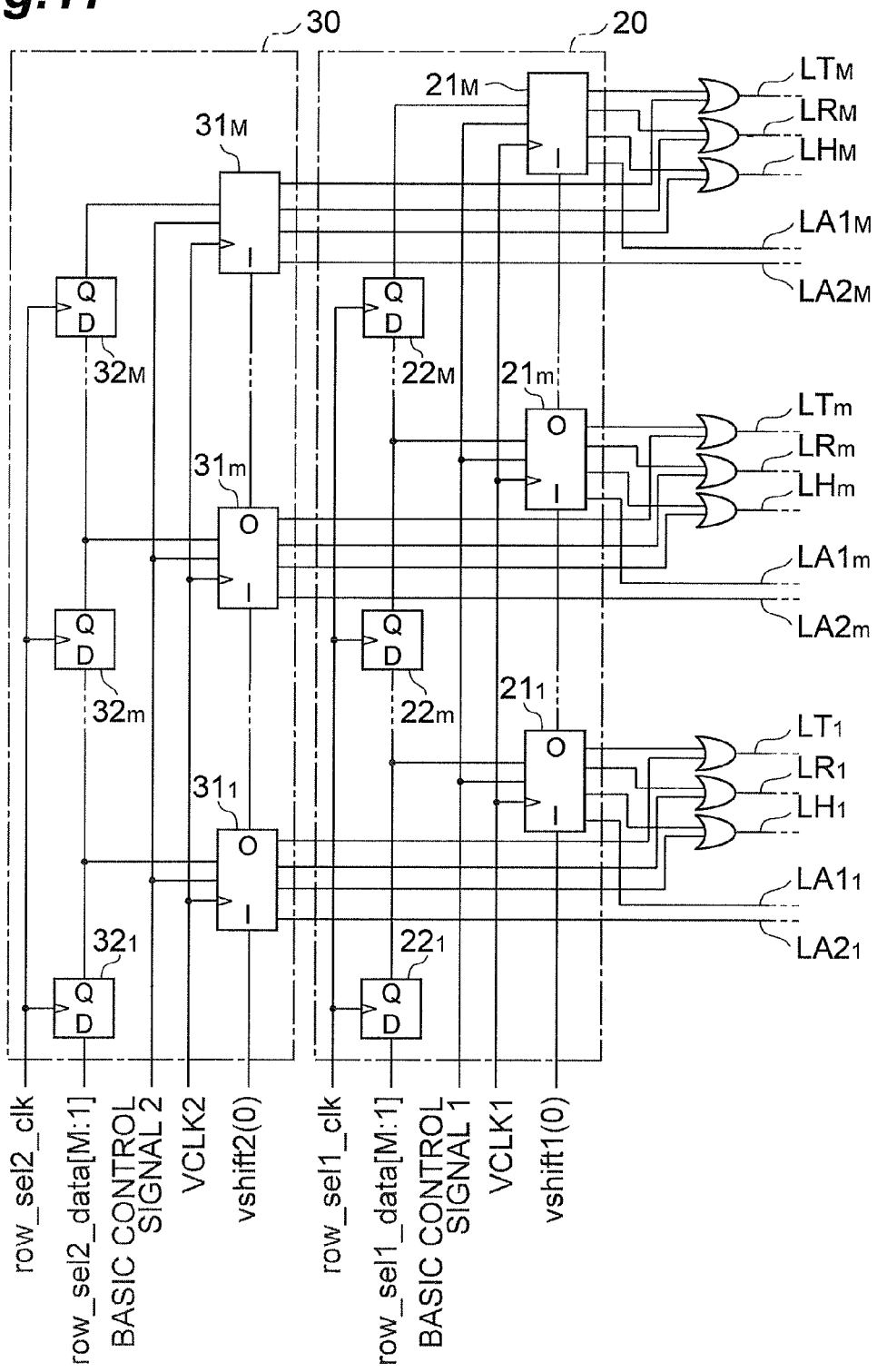
FIG. 11 is a diagram showing configurations of a first row selecting section 20 and a second row selecting section 30 of the solid-state image pickup device 2 according to the second embodiment.

FIG. 11 is a diagram showing configurations of the first row selecting section 20 and the second row selecting section 30 of the solid-state image pickup device 2 according to the second embodiment. The first row selecting section 20 in the second embodiment has a configuration which is the same as that in the first embodiment described with reference to FIGS. 5 and 6, that includes M control signal generating circuits $21_1$ to $21_M$ composing a first shift register and M latch circuits $22_1$ to $22_M$ composing a second shift register. The second row selecting section 30 has a configuration which is the same as that of the first row selecting section 20, that includes M control signal generating circuits $31_1$ to $31_M$ composing a first shift register and M latch circuits $32_1$ to $32_M$ composing a second shift register, and these are configured in the same way as the first row selecting section 20.

The first row selecting section 20 is provided with a vshift1(0) signal, a clock VCLK1, a basic control signal 1, M-bit data row_sel1_data[M:1], and a clock row_sel1_clk from the control section 60. The second row selecting section 30 is provided with a vshift2(0) signal, a clock VCLK2, a basic control signal 2, M-bit data row_sel2_data[M:1], and a clock row_sel2_clk from the control section 60, and operates in the same way as the first row selecting section 20.

The respective bit data row_sel1_data[m] and data row_sel2_data[m] are not raised to a high level simultaneously, and at least one of these is at a low level. The respective bit data row_sel1_data[m] and data row_sel2_data[m] may be in a relationship of logic-inverting each other. In this case, it is preferable that a NOT circuit be provided, to cause the latch circuits $22_m$ and $32_m$ to hold the data row_sel1_data[m] to be held by the latch circuit $22_m$ in the first row selecting section 20 and the data row_sel2_data[m] to be held by the latch circuit $32_m$ in the second row selecting section 30 so that their logics are inverted with each other.

When the data row_sel1_data[m] to be held by a corresponding latch circuit $22_m$ is at a high level, each control signal generating circuit $21_m$ of the first row selecting section 20 outputs the Reset1(m) signal as a Reset(m) signal to the control signal line $LR_m$ via the OR circuit provided to one terminal of the control signal line $LR_m$, outputs the Trans1(m)

signal as a Trans(m) signal to the control signal line $LT_m$ via the OR circuit provided to one terminal of the control signal line $LT_m$, outputs the Hold1($m$) signal as a Hold(m) signal to the control signal line $LH_m$ via the OR circuit provided to one terminal of the control signal line $LH_m$, and outputs the Address1($m$) signal to the control signal line $LA1_m$.

When the data row_sel2_data[m] to be held by a corresponding latch circuit $32_m$ is at a high level, each control signal generating circuit $31_m$ of the second row selecting section 30 outputs the Reset1($m$) signal as a Reset(m) signal to the control signal line $LR_m$ via the OR circuit provided to one terminal of the control signal line $LR_m$, outputs the Trans2($m$) signal as a Trans(m) signal to the control signal line $LT_m$ via the OR circuit provided to one terminal of the control signal line $LT_m$, outputs the Hold2($m$) signal as a Hold(m) signal to the control signal line $LH_m$ via the OR circuit provided to one terminal of the control signal line $LH_m$, and outputs the Address2($m$) signal to the control signal line $LA2_m$.

The solid-state image pickup device 2 according to the second embodiment as well operates in the same way as the solid-state image pickup device 1 according to the first embodiment, to be capable of performing the same effects.

Further, the present invention is not limited to the first and second respective embodiments. For example, the diffusion region connected to the gate terminal of the transistor T3 is exemplified as a charge accumulating section in the above-described embodiments. However, a photodiode may function as a charge accumulating section.

INDUSTRIAL APPLICABILITY

It is possible to suppress an increase in region area per pixel unit and a reduction in aperture ratio in a solid-state image pickup device for optical communication, which is applicable to usage for flexibly responding to a variation in the number of optical signal receiving regions in its light receiving section.

REFERENCE SIGNS LIST 1, 2 . . . solid-state image pickup device, 10 . . . light receiving section, 20 . . . first row selecting section, $21_1$ to $21_M$ . . . control signal generating circuit, $22_1$ to $22_M$ . . . latch circuit, 30 . . . second row selecting section, $31_1$ to $31_M$ . . . control signal generating circuit, $32_1$ to $32_M$ . . . latch circuit, 40 . . . first readout section, $41_1$ to $41_N$ . . . holding section, 42 . . . first column selecting section, 43 . . . difference arithmetic section, 50 . . . second readout section, $51_1$ to $51_N$ . . . holding section, 52 . . . first column selecting section, 53 . . . difference arithmetic section, 60 . . . control section, $P_{1,1}$ to $P_{M,N}$ . . . pixel unit, $L1_1$ to $L1_N$, $L2_1$ to $L2_N$, readout signal line, $LT_1$ to $LT_M$, $LR_1$ to $LR_M$, $LH_1$ to $LH_M$, $LA1_1$ to $LA1_M$, $LA2_1$ to $LA2_M$ . . . control signal line

The invention claimed is:

1. A solid-state image pickup device comprising:
a light receiving section where M×N pixel units $P_{1,1}$ to PM,N each including a photodiode that generates charge of an amount according to an incident light amount, a charge accumulating section in which the charge is accumulated, a first switch for outputting data corresponding to an accumulated charge amount in the charge accumulating section, and a second switch for outputting data corresponding to the accumulated charge amount in the charge accumulating section are two-dimensionally arrayed in M rows and N columns;
a first row selecting section which selects any m1-th row in the light receiving section, and causes each pixel unit $P_{m1,n}$ of the row to accumulate the charge generated in the photodiode in the charge accumulating section, and to output data corresponding to the accumulated charge amount in the charge accumulating section to a readout signal line $L1_n$ by closing the first switch;
a second row selecting section which selects any m2-th row in the light receiving section, and causes each pixel unit $P_{m2,n}$ of the row to accumulate the charge generated in the photodiode in the charge accumulating section, and to output data corresponding to the accumulated charge amount in the charge accumulating section to a readout signal line $L2_n$ by closing the second switch;
a first readout section which is connected to N readout signal lines $L1_1$ to $L1_N$, for which data output from each pixel unit $P_{m1,n}$ of the m1-th row in the light receiving section selected by the first row selecting section to the readout signal line $L1_n$ is input, and from which data corresponding to an amount of the charge generated in the photodiode of each pixel unit $P_{m1,n}$ of the m1-th row is output; and
a second readout section which is connected to N readout signal lines $L2_1$ to $L2_N$, for which data output from each pixel unit $P_{m2,n}$ of the m2-th row in the light receiving section selected by the second row selecting section to the readout signal line $L2_n$ is input, and from which data corresponding to an amount of the charge generated in the photodiode of each pixel unit $P_{m2,n}$ of the m2-th row is output, wherein
the first row selecting section and the second row selecting section select rows different from each other in the light receiving section, and
the first row selecting section and the first readout section, and the second row selecting section and the second readout section operate in parallel with each other (provided that M and N are each an integer not less than 2, m, m1, and m2 are each an integer not less than 1 and not more than M, and n is an integer not less than 1 and not more than N), wherein
in the light receiving section, a control signal line for providing control signals giving instructions for discharge from each of a junction capacitance section of the photodiode and the charge accumulating section in each pixel unit $P_{m,n}$ and for charge accumulation by the charge accumulating section to each pixel unit $P_{m,n}$, is provided to every row, and a switch or a tri-state buffer is provided to each terminal of each control signal line,
the first row selecting section outputs the control signal to the control signal line via the switch or the tri-state buffer provided to a first terminal of the control signal line of the m1-th row, and
the second row selecting section outputs the control signal to the control signal line via the switch or the tri-state buffer provided to a second terminal of the control signal line of the m2-th row.

2. The solid-state image pickup device according to claim 1, wherein the first row selecting section includes M latch circuits, and when data held in an m1-th latch circuit among the M latch circuits is a significant value, the first row selecting section outputs the control signal to the control signal line via the switch or the tri-state buffer provided to the first terminal of the control signal line of the m1-th row, and
the second row selecting section includes M latch circuits, and when data held in an m2-th latch circuit among the M latch circuits is a significant value, the second row selecting section outputs the control signal to the control signal line via the switch or the tri-state buffer provided to the second terminal of the control signal line of the m2-th row.

3. The solid-state image pickup device according to claim 1, wherein
in the light receiving section, a control signal line for providing control signals giving instructions for discharge from each of a junction capacitance section of the photodiode and the charge accumulating section in each pixel unit $P_{m,n}$ and for charge accumulation by the charge accumulating section to each pixel unit $P_{m,n}$ is provided to every row, and an OR circuit is provided to one terminal of each control signal line,
the first row selecting section outputs the control signal to the control signal line via the OR circuit provided to the one terminal of the control signal line of the m1-th row, and
the second row selecting section outputs the control signal to the control signal line via the OR circuit provided to the one terminal of the control signal line of the m2-th row.

4. The solid-state image pickup device according to claim 3, wherein
the first row selecting section includes M latch circuits, and when data held in an m1-th latch circuit among the M latch circuits is a significant value, the first row selecting section outputs the control signal to the control signal line via the OR circuit provided to the one terminal of the control signal line of the m1-th row, and
the second row selecting section includes M latch circuits, and when data held in an m2-th latch circuit among the M latch circuits is a significant value, the second row selecting section outputs the control signal to the control signal line via the OR circuit provided to the one terminal of the control signal line of the m2-th row.

5. The solid-state image pickup device according to claim 2 or claim 4, wherein
the M latch circuits of each of the first row selecting section and the second row selecting section are cascade-connected in order of the rows, to compose a shift register, and M-bit data is serial-input to a latch circuit at the first stage in the shift register, to cause each latch circuit to hold data.

6. The solid-state image pickup device according to claim 2 or claim 4, wherein
the first row selecting section sequentially outputs the control signals at a constant time interval to a plurality of rows corresponding to latch circuits with holding data of significant values among the M latch circuits included in the first row selecting section, and
the second row selecting section sequentially outputs the control signals at a constant time interval to a plurality of rows corresponding to latch circuits with holding data of significant values among the M latch circuits included in the second row selecting section.

7. A solid-state image pickup device comprising:
a light receiving section where M×N pixel units $P_{1,1}$ to PM,N each including a photodiode that generates charge of an amount according to an incident light amount, a charge accumulating section in which the charge is accumulated, a first switch for outputting data corresponding to an accumulated charge amount in the charge accumulating section, and a second switch for outputting data corresponding to the accumulated charge amount in the charge accumulating section are two-dimensionally arrayed in M rows and N columns;
a first row selecting section which selects any m1-th row in the light receiving section, and causes each pixel unit $P_{m1,n}$ of the row to accumulate the charge generated in the photodiode in the charge accumulating section, and to output data corresponding to the accumulated charge amount in the charge accumulating section to a readout signal line $L1_n$ by closing the first switch;
a second row selecting section which selects any m2-th row in the light receiving section, and causes each pixel unit $P_{m2,n}$ of the row to accumulate the charge generated in the photodiode in the charge accumulating section, and to output data corresponding to the accumulated charge amount in the charge accumulating section to a readout signal line $L2_n$ by closing the second switch;
a first readout section which is connected to N readout signal lines $L1_1$ to $L1_N$, for which data output from each pixel unit $P_{m1,n}$ of the m1-th row in the light receiving section selected by the first row selecting section to the readout signal line $L1_n$ is input, and from which data corresponding to an amount of the charge generated in the photodiode of each pixel unit $P_{m1,n}$ of the m1-th row is output; and
a second readout section which is connected to N readout signal lines $L2_1$ to $L2_N$, for which data output from each pixel unit $P_{m2,n}$ of the m2-th row in the light receiving section selected by the second row selecting section to the readout signal line $L2_n$ is input, and from which data corresponding to an amount of the charge generated in the photodiode of each pixel unit $P_{m2,n}$, of the m2-th row is output, wherein
the first row selecting section and the second row selecting section select rows different from each other in the light receiving section, and
the first row selecting section and the first readout section, and the second row selecting section and the second readout section operate in parallel with each other (provided that M and N are each an integer not less than 2, m, m1, and m2 are each an integer not less than 1 and not more than M, and n is an integer not less than 1 and not more than N), wherein
in the light receiving section, a control signal line for providing control signals giving instructions for discharge from each of a junction capacitance section of the photodiode and the charge accumulating section in each pixel unit $P_{m,n}$ and for charge accumulation by the charge accumulating section to each pixel unit $P_{m,n}$ is provided to every row, and an OR circuit is provided to one terminal of each control signal line,
the first row selecting section outputs the control signal to the control signal line via the OR circuit provided to the one terminal of the control signal line of the m1-th row, and
the second row selecting section outputs the control signal to the control signal line via the OR circuit provided to the one terminal of the control signal line of the m2-th row.

* * * * *